(12) United States Patent
Gluch et al.

(10) Patent No.: US 7,132,843 B2
(45) Date of Patent: Nov. 7, 2006

(54) METHOD AND APPARATUS FOR POSITIONING A TEST HEAD ON A PRINTED CIRCUIT BOARD

(75) Inventors: Josef Gluch, Cary, NC (US); Boris Safin, Augsburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/863,237

(22) Filed: Jun. 9, 2004

(65) Prior Publication Data
US 2005/0043826 A1    Feb. 24, 2005

(30) Foreign Application Priority Data
Jun. 10, 2003    (DE)    ................ 103 26 086

(51) Int. Cl.
*G01R 31/02*    (2006.01)
(52) U.S. Cl. .............. 324/765; 324/758; 324/158.1
(58) Field of Classification Search ............ None
See application file for complete search history.

(56) References Cited
U.S. PATENT DOCUMENTS

| | | | |
|---|---|---|---|
| 4,626,907 A * | 12/1986 | Schedewie | ............ 348/95 |
| 5,768,107 A * | 6/1998 | Ouchi et al. | ............ 361/792 |
| 6,293,007 B1 * | 9/2001 | Kuriyama et al. | ............ 29/840 |
| 6,480,012 B1 * | 11/2002 | Komori | ............ 324/754 |
| 6,612,159 B1 | 9/2003 | Knutrud | |

FOREIGN PATENT DOCUMENTS

| | | |
|---|---|---|
| DE | 199 15 052 A1 | 10/2000 |
| DE | 101 39 755 A1 | 3/2002 |

* cited by examiner

*Primary Examiner*—Minh N. Tang
(74) *Attorney, Agent, or Firm*—Slater & Matsil, L.L.P.

(57) ABSTRACT

A method and apparatus for positioning a test head with respect to a printed circuit board. Adjusting marks having two parts, a frame and a mark positioned within a region enclosed by the frame, are provided on the printed circuit board. The frame and the mark within the frame are at a defined potential, which may be measured by the test head. Methods for positioning the test head are provided whereby the test head is initially positioned within an area bounded by the frame of the first adjusting mark and the test head is then re-positioned via a search algorithm which determines the coordinates of the mark within the region enclosed by the frame; the steps of positioning and repositioning of the test head are repeated at a second adjusting mark, and the determined coordinates are used to determine positioning of the test head.

20 Claims, 2 Drawing Sheets

METHOD AND APPARATUS FOR POSITIONING A TEST HEAD ON A PRINTED CIRCUIT BOARD

FIELD

The following relates to a method for positioning a test head, which is suitable for electrical measurements, by means of a computation unit on a printed circuit board. The following also relates to adjusting marks for adjustment of the test head on a printed circuit board.

BACKGROUND

Automatic mechanical test systems for checking functions of microelectronic arrangements, such as DRAM (Dynamic Random Access Memory) memory chips, are used in development and production. Normally, during measurements by an automatic mechanical test system, the memory chip to be measured is fixed on a printed circuit board. A test head with one or more test probes for recording electrical parameters, such as potentials, currents or resistances, is positioned on contact surfaces of the memory chip to be tested, on which contact surfaces a measurement is intended to be carried out. The test head is coupled to a mechanical apparatus which allows positioning on a plane and at right angles to the plane. A computation unit which is connected to the test head is used for evaluation of the measured signals, and for calculating and controlling positioning operations of the test head on the printed circuit board.

Before the use of an automatic measurement system, the test head is normally adjusted with respect to one or more reference points on the printed circuit board. Subsequent position determination processes can then be carried out with respect to coordinates of the reference points. On the basis of the prior art, the adjustment process was carried out by the user visually checking the automatic measurement system. Adjustment by eye is inaccurate and is dependent on the individual person for the necessary positioning accuracies, which may be in the order of magnitude of millimeters or even micrometers.

One known alternative to visual checking is the use of optical identification systems. However, additional fitting of an automatic measurement system for measurement of electrical parameters by means of an optical identification system is expensive and is technically complex.

SUMMARY

The following discloses a method for positioning a test head on a printed circuit board with a predetermined accuracy, and for providing adjusting marks for adjustment of the test head.

A method of positioning a test head, suitable for electrical measurements, by means of a computation unit on a printed circuit board, is disclosed. At least one first and one second adjusting mark is provided on a printed circuit board, wherein the adjusting marks are provided in at least two parts, with a frame, which is bounded by an outer edge and an inner edge, enclosing a region, and at least one mark being arranged in the region, and the frame and the mark are at a defined measurement potential. The test head is initially positioned within an area which is bounded by the outer edge of the first adjusting mark, and re-positioned via a search algorithm in a computation unit. The positioning steps are repeated at a second adjusting mark.

An adjusting mark for adjustment of a test head in a plane is disclosed. A frame is included, bounded by an outer edge and an inner edge, with at least one mark that is arranged within a region that is surrounded by the inner edge of the frame. At least one characteristic of the frame and the at least one mark that can be recorded by the test head and matched to the test head.

DETAILED DESCRIPTION OF THE PREFERRED EMBODIMENTS

Figure 1:
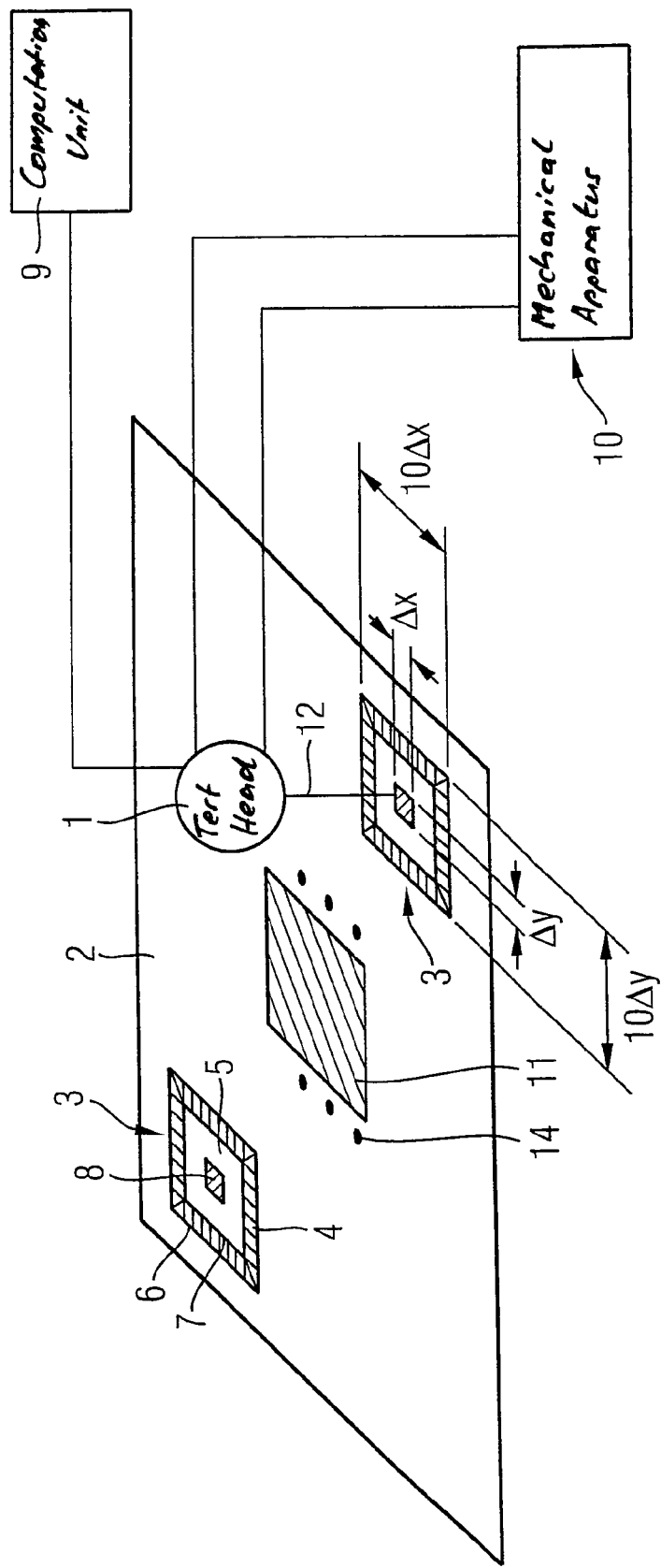
FIG. 1 illustrates a measurement system with a printed circuit board and an adjusting mark, in accordance with an embodiment of the present invention.

The following is a list of symbols that are used consistently throughout the text and drawings:
1 Test head
2 Printed circuit board
3 Adjusting mark
4 Frame
5 Region
6 Outer edge
7 Inner edge
8 Mark
9 Computation unit
10 Mechanical apparatus
11 Microelectronic arrangement
12 Test probe
13 Adjusting mark for height adjustment
14 Contact surface
15 Test area To position a test head that is suitable for electrical measurements on a printed circuit board by means of a computation unit, at least one first and one second adjusting mark are provided on the printed circuit board. In this case, the adjusting marks are provided in at least two parts. A frame, which is bounded by an outer edge and an inner edge, encloses a region in which at least one mark is arranged. The frame and the mark are at a defined measurement potential. The test head is now positioned within an area which is bounded by the outer edge of the first adjusting mark. The test head is then positioned by the computation unit in accordance with a search algorithm in order to receive potential values which are associated with the frame and with the region.

Data that is transmitted from the test head to the computation unit is evaluated by the computation unit, and a position and a length of the inner edge which is associated with the frame is calculated. The position of the mark is then calculated by the computation unit. The test head is then moved to the calculated position of the mark. The test head detects the mark by means of potential measurements.

Coordinates of the mark are stored in the computation unit. This method is repeated at least for one second adjusting mark, and subsequent position determinations of the test head with respect to the printed circuit board are carried out using the determined coordinates of the marks.

At least two adjusting marks are provided in order to make it possible to correct the position of the test head with respect to rotation of the printed circuit board on a plane. The use of at least two-part adjusting marks, in accordance with an aspect of the invention, in which at least one mark is enclosed by a frame, has an advantage that the sizes of the frames and marks may be of different orders of magnitude. It is also possible to form the frame from two or more individual parts, and/or to provide two or more marks. The frame may be of a size that can be identified easily by the user, so that the test head can be positioned on the frame by visual checking. The mark to be detected by the test head may have dimensions in the same order of magnitude as the positioning accuracy. During the process of detection of the mark, the test head position is then determined with the specified positioning accuracy.

The frame and the mark are at a defined measurement potential. The measurement potential is not the same as the potential of the region enclosed by the frame, outside the mark. This procedure advantageously uses a measurement characteristic of the test head, by means of which it is possible, inter alia, to determine potentials, in order to identify the adjusting mark. This makes it possible to avoid complex optical identification systems for automatically driving to the adjusting mark. The test head can now be positioned on the frame by the user in a simple manner. The computation unit now uses a simple binary search algorithm, whose variable may assume two states, specifically the potential of the frame and the potential of the region, to position the test head for potential measurements in order to determine the position and length of the inner edge of the frame. The determined data is evaluated by the computation unit, which calculates the position and length of the inner edge, and the position of the mark.

The test head is then automatically moved to the position calculated for the mark. If the mark is not at the calculated position, then only a small number of search steps by means of the test head are required in order to detect the mark. Once the test head has detected the mark, then the coordinates of the mark are stored in the computation unit. The process can be repeated at a second adjusting mark. The test head is now adjusted. Subsequent position determinations by the test head with respect to the printed circuit board are carried out with the predetermined positioning accuracy, using the automatically determined coordinates of the marks.

The test head may be adjusted roughly once by eye by the user, and is then finely adjusted automatically to a desired accuracy by using the measurement characteristic of the test head. In this case, the desired positioning accuracy can advantageously be set by suitable choice of the length and width dimensions of the mark.

The dimensions of the mark are intended to be in the same order of magnitude as the positioning accuracy of the test head. Such mark length and width dimension sizes have the advantage that the test head can be positioned with the predetermined positioning accuracy on the printed circuit board once the mark has been detected.

The mark is advantageously arranged at the center of the region, which is bounded by the frame. Arranging the mark at the center of the region simplifies the calculation of the position of the mark from the data determined from the inner edge. It also is advantageous for the frame to be square. A simple frame shape, such as a square, offers the advantage that the position and the length of the inner edge can be determined quickly. Other geometric frame shapes are also feasible, such as an annulus, a rectangle, a triangle or some other polygon. Further, the length of the outer edge is preferably twice as great as the length of the inner edge of the frame. Additionally, the width of the frame and the size of the bounded region are advantageously matched to the binary search algorithm, so that only a small number of search steps are required in order to make it possible to calculate the dimensions of the inner edge.

An adjusting mark for adjustment of a test head on a plane has a frame, which is bounded by an outer edge and an inner edge, and has at least one mark, which is arranged within a region that is surrounded by the frame. The frame and the at least one mark have at least one characteristic that can be recorded by the test head and is matched to the test head. The advantage of a two-part adjusting mark, comprising the frame and the mark, is that the dimensions of the frame and the mark may be chosen to be in different orders of magnitude, which may correspond to coarse adjustment and fine adjustment, one of which can be carried out by a visual check, and the other by automatic matching. If the mark and frame have a characteristic which can be measured by the test head, then there is advantageously no need to use additional optical identification systems for adjustment of the test head.

The frame and the mark are preferably composed of a conductive material which has a defined measurement potential. The material may, for example, be an uninsulated conductor track composed of copper, which has a bare copper surface. This advantageously ensures that the frame and the mark are not at the same potential as the enclosed area and the surrounding printed circuit board. A potential difference between the adjusting mark and the enclosed or surrounding region is a characteristic that can be measured by the test head without any additional equipment. This particularly advantageously allows automatic identification of the positions of the frame and the mark on the printed circuit board.

The dimensions of the length and width of the marks are advantageously in the same order of magnitude as the positioning accuracy of the test head. This choice for the dimensions of the marks allows the position of the test head on the printed circuit board to be determined with the predetermined accuracy. The frame preferably has a symmetrical shape. A symmetrical shape advantageously makes it easier to determine the length and position of the inner edge of the frame. One mark is advantageously arranged at the center of the region. A specific arrangement such as this makes it easier to determine the position of the mark. The frame preferably has a square shape. A square shape means that it is particularly simple to determine the length and position of the inner edge, and to calculate the position of the mark. The length of the outer edge of the frame is twice as great as the length of the inner edge of the frame. This advantageously results in the width of the frame and the diameter of the region bounded by the frame being matched to the search algorithm so that only a small number of search steps are required in order to determine the position and length of the inner edge.

Two adjusting marks 3 are located on a printed circuit board 2 for positioning of a test head 1. The adjusting marks each comprise a frame 4 and a mark 8, with the frame 4 being bounded by an outer edge 6 and an inner edge 7. This surrounds a region 5 in which the mark 8 is located. The frame 4 and the mark 8 are at a predetermined defined measurement potential, which is not the same as the potential in the region 5. The length and width of the mark 8 $\Delta x$ and $\Delta y$ are chosen such that they correspond to the positioning accuracy of the test head 1. The outer edge 6 of the frame 4 is approximately ten times as long and wide as the mark. If, for example, the mark has a length and a width $\Delta x$ and $\Delta y$ of 1 mm, then the outer edge 6 of the frame 4 has a length of 10 mm. With these dimensions of the frame 4, the test head 1 can easily be coarsely adjusted by the user with respect to the frame 4 by visual checking. The test head 1 is coupled to a mechanical apparatus 10, which has three degrees of movement freedom. Two of these degrees of freedom are on a plane, and on degree of freedom is at right angles to the plane. The subsequent procedure involves the determination of a position on the plane.

The foregoing is now described with reference to the figures. As shown, the test head 1 is adjusted coarsely with respect to the frame 4 by a user. The test head 1 is then positioned by a connected computation unit 9 in accordance with a search algorithm in order to carry out potential measurements. The position and length of the inner edge 7 of the frame 4 are then calculated on the basis of the data transmitted from the test head 1 to the computation unit 9. The computation unit 9 then calculates the position of the mark 8.

The test head 1 is now automatically moved to the calculated position of the mark 8. The test head now carries out a measurement to determine whether it is or is not at the position of the mark 8. If it has not yet reached the mark 8, then a small number of search steps are required in order to find and to detect the mark 8. Once the mark 8 has been detected, the coordinates of the mark 8 are stored in the computation unit 9. The method is repeated at a second adjusting mark 3, and subsequent processes for determining the position of the test head 1 are carried out, using the determined coordinates of the marks 8, with the predetermined positioning accuracy $\Delta x$, $\Delta y$ on the printed circuit board 2 in order to drive to the contact surfaces to be measured on the microelectronic arrangement 11 to be tested.

In FIG. 1, the test head 1 is shown connected to a test probe 12, which is coupled to a mechanical apparatus 10 and is connected to a computation unit 9. There are two adjusting marks 3 on the printed circuit board 2, which comprise a frame 4 (which is bounded by an outer edge 6 and an inner edge 7) and surround a region 5. A mark 8 is located at the center of the frame 4. The mark 8 has a length $\Delta y$ and a width $\Delta x$. The outer edge of the frame has a length $10'\Delta y$ and a width $10'\Delta x$. The microelectronic arrangement 11 with contact surfaces 14, which is provided for measurement purposes, is located on the printed circuit board 2.

Figure 2:
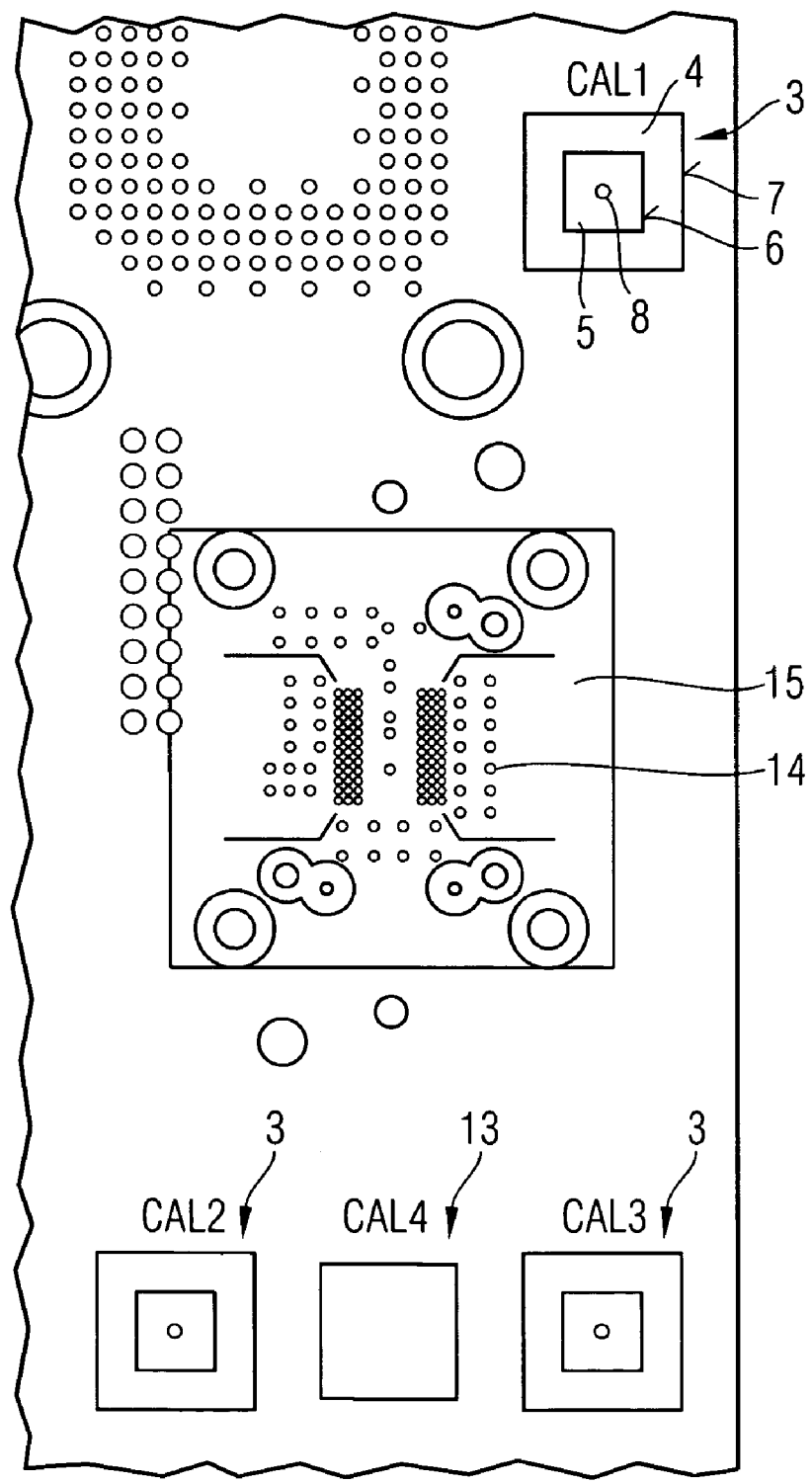
FIG. 2 illustrates a detail from an actual printed circuit board with adjusting marks, in accordance with an embodiment of the present invention.

A detail from an actual printed circuit board 2 is shown in FIG. 2. Three adjusting marks 3 can be seen on the printed circuit board 2. The adjusting marks 3 comprise a metallic frame 4 and a mark 8, which is arranged at the center of the region 5 surrounded by the frame 4 and is composed of the same material as the frame 4. Two adjusting marks 3 are required in order to make it possible to adjust the test head 1 on the plane. The third adjusting mark 3 is used only for test purposes. A further adjusting mark, which can be seen on the detail, is used to adjust the height 13 of the test head 1. The microelectronic arrangement 11 to be measured is mounted on the test area 15 and is in the form of a memory chip. The contact surfaces 14 on the memory chip that the test head must drive to are of the same order of magnitude as the marks 8. This ensures that the test head 1 can be positioned on the contact surfaces 14 with sufficient precision.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method of positioning a test head, suitable for electrical measurements, by means of a computation unit on a printed circuit board, comprising:

providing at least one first and at least one second adjusting mark on the printed circuit board, wherein the at least one first and at least one second adjusting marks each comprise at least two parts, comprising a frame, which is bounded by an outer edge and an inner edge, enclosing a region, and each further comprising at least one enclosed mark being arranged in the region, and wherein each of the frames and the corresponding at least one enclosed mark are at a defined measurement potential;

initially positioning the test head within an area which is bounded by the outer edge of the first adjusting mark;

re-positioning the test head within the area via a search algorithm in the computation unit in order to receive potential values which are associated with the corresponding frame of the first adjusting mark and the corresponding region of the first adjusting mark, wherein data that is fransrnitted from the test head to the computation unit is evaluated, and the computation unit calculates the position and length of the inner edge of the first adjusting mark, which is associated with the frame of the first adjusting mark, and the position of the corresponding enclosed mark of the first adjusting mark, such that the test head is moved to the calculated position of the enclosed mark of the first adjusting mark, wherein the test head detects the enclosed mart of the first adjusting mark by means of potential measurements, and determined first coordinates of the enclosed mark of the first adjusting mark are stored in the computation unit;

repeating the above recited steps of initially positioning the test head within an area and re-positioning the test head via a search algorithm at the second adjusting mark to obtain determined second coordinates of the corresponding enclosed mark of the second adjusting mark, and subsequently determining positioning of the test head with respect to the printed circuit board according to the determined first and second coordinates of the enclosed marks of the first and second adjusting marks.

2. The method as in claim 1, wherein the dimensions of the corresponding enclosed mark of the first and second adjustment marks are the same order of magnitude as the positioning accuracy of the test head, respectively.

3. The method as in claim 1, wherein each of the enclosed marks of the at least first and at least second adjustment marks is arranged at the center of the region which is bounded by the corresponding frame.

4. The method as in claim 1, wherein each of the frames is square.

5. The method as in claim 4, wherein the length of the outer edge is twice as great as the length of the inner edge of each of the frames.

6. An adjusting mark for adjustment of a test head in a plane, comprising:
  a frame, bounded by an outer edge and an inner edge, with at least one enclosed mark that is arranged within a region that is surrounded by the inner edge of the frame, and
  the frame and the at least one enclosed mark having a characteristic that is recorded by the test head after data are transmitted from the test head to a computation unit.

7. The adjusting mark as in claim 6, wherein the frame and the enclosed mark are composed of a conductive material.

8. The adjusting mark as in claim 6, wherein the frame and the enclosed mark are at a defined measurement potential.

9. The adjusting mark as in claim 6, wherein the dimensions of the length and width of the enclosed mark are intended to be in the same order of magnitude as the positioning accuracy of the test head.

10. The adjusting mark as in claim 6, wherein the frame has a symnitetijoal shape.

11. The adjusting mark as in claim 6, wherein the at least one enclosed mark is arranged at the center of the region.

12. The adjusting mark as in claim 11, wherein the frame has a square shape.

13. The adjusting mark as in claim 12, wherein the length of the outer edge of the frame is twice as great as the length of the inner edge of the frame.

14. A method of positioning a test head, suitable for electrical measurements, by means of a computation unit on a printed circuit board, comprising:
  providing at least one first and at least one second adjusting mark on the printed circuit board, wherein the at least first and at least second adjusting marks each comprise at least two pans, each with a frame, which is bounded by an outer edge and an inner edge, enclosing a region, and each further comprising at least one enclosed mark being arranged in the region, and wherein the frame of the first and second adjusting marks and the corresponding enclosed mark are at a defined measurement potential;
  initially positioning the test head within an area which is bounded by the outer edge of the first adjusting mark;
  re-positioning the test head via a search algorithm in a computation unit; and
  repeating the above recited steps of initially positioning the test head within an area and re-positioning the test bead via a search algoritbm at the second adjusting mark.

15. The method of claim 14, wherein the test head is re-positioned via a search algorithm in order to receive potential values which, are associated with the respective frame and the corresponding region, wherein data that is transmitted from the test head to the computation unit is evaluated, and the computation unit calculates the position and length of the inner edge, which is associated with the respective frame, and the position of the corresponding at least one enclosed mark, such that tbe test head is moved to the calculated position of the corresponding enclosed mark, wherein the test head detects the corresponding enclosed mark by means of potential measurements, and determined coordinates of the corresponding enclosed mark are stored in the computation unit.

16. A method of positioning a test head, suitable for the electrical measurements, by means of a computation unit on a printed circuit board, compnsing:
  providing at least one first and at least one second adjusting mark on the printed circuit board, wherein the at least first and at least second adjusting marks comprise at least two parts, each with a frame, which is bounded by an outer edge and an inner edge, enclosing a region, and each further comprising at least one enclosed mark being arranged in the region, and wherein the frame of the first and second adjusting marks and the corresponding enclosed mark are at a defined measurement potential;
  initially positioning the test head within an area which is bounded by the outer edge of the first adjusting mark;
  re-positioning the test head via a search algorithm in a computation unit wherein the test head is positioned at the corresponding adjusting mark and measurement of the defined measurement potential is taken by the test head and the data is fed to the search algorithm; and
  repeating the above recited steps of initially positioning the test head and re-positioning the test head at the second adjusting mark.

17. The method of claim 16, wherein the step of initially positioning the test head is performed responsive to a visual inspection of the first adjustment mark.

18. The method of claim 17, wherein the step of repositioning the test head via a search algorithm is performed automatically responsive to data corresponding to the measurements of potential.

19. The method of claim 18, wherein the step of initially positioning the test head responsive to a visual inspection is done manually.

20. The method of claim 16, wherein the defined electrical measurement potential for the frames and the corresponding enclosed marks is different from the defined electrical measurement potential for the remainder of the corresponding region enclosed within the frames.

* * * * *

UNITED STATES PATENT AND TRADEMARK OFFICE
CERTIFICATE OF CORRECTION

PATENT NO. : 7,132,843 B2
APPLICATION NO. : 10/863237
DATED : November 7, 2006
INVENTOR(S) : Gluch et al.

It is certified that error appears in the above-identified patent and that said Letters Patent is hereby corrected as shown below:

Column 6, line 41; delete "fransrnitted" insert --transmitted--
Column 7, line 28; delete "symnitetijoal" insert --symmetrical--
Column 7, line 42; delete "pans" insert --parts--
Column 7, line 55; delete "bead" insert --head--
Column 7, line 55; delete "algoritbm" insert --algorithm--
Column 8, line 3; delete "which, are" insert --which are--
Column 8, line 9; delete "tbe" insert --the--
Column 8, line 17; delete "compnsing" insert --comprising--

Signed and Sealed this

Thirtieth Day of January, 2007

JON W. DUDAS
*Director of the United States Patent and Trademark Office*